(12) United States Patent
Lim et al.

(10) Patent No.: US 8,619,484 B2
(45) Date of Patent: Dec. 31, 2013

(54) SEMICONDUCTOR DEVICE, METHOD OF ADJUSTING LOAD CAPACITANCE FOR THE SAME, AND SEMICONDUCTOR SYSTEM INCLUDING THE SAME

(75) Inventors: Jong Hyoung Lim, Seoul (KR); Sang Seok Kang, Suwon-si (KR); Hyung Shin Kwon, Hwaseong-si (KR)

(73) Assignee: Samsung Electronics Co., Ltd, Suwon-Si, Gyeonggi-Do (KR)

( * ) Notice: Subject to any disclaimer, the term of this patent is extended or adjusted under 35 U.S.C. 154(b) by 6 days.

(21) Appl. No.: 13/228,102

(22) Filed: Sep. 8, 2011

(65) Prior Publication Data

US 2012/0063251 A1   Mar. 15, 2012

(30) Foreign Application Priority Data

Sep. 14, 2010  (KR) .................... 10-2010-0089746

(51) Int. Cl.
*G11C 7/02* (2006.01)
(52) U.S. Cl.
USPC ............................................. 365/207
(58) Field of Classification Search
USPC ............................................. 365/207
See application file for complete search history.

(56) References Cited

U.S. PATENT DOCUMENTS

| 6,965,531 | B2 | 11/2005 | Mine |
| 2001/0033514 | A1* | 10/2001 | Takata et al. ............. 365/189.07 |
| 2003/0107365 | A1* | 6/2003 | Brunelle et al. .............. 324/200 |
| 2003/0156440 | A1* | 8/2003 | Hata et al. ........................ 365/49 |
| 2007/0037334 | A1* | 2/2007 | Muemmler et al. .......... 438/197 |
| 2008/0298153 | A1* | 12/2008 | Mae .............................. 365/222 |
| 2010/0061168 | A1* | 3/2010 | Aakjer .......................... 365/200 |

FOREIGN PATENT DOCUMENTS

| JP | 07-153258 | 6/1995 |
| KR | 1020070063789 A | 6/2007 |
| KR | 1020100036596 A | 4/2010 |

OTHER PUBLICATIONS

Alexander et al. "Fundamentals of Electric Circuits", Fourth Edition, McGraw-Hill international edition.2009, previous edition 2007, 2004, and 2000.*

* cited by examiner

*Primary Examiner* — Hoai V Ho
*Assistant Examiner* — Min Huang
(74) *Attorney, Agent, or Firm* — F. Chau & Associates, LLC

(57) ABSTRACT

A semiconductor device includes a bit line, a complementary bit line, a sense amplifier configured to sense and amplify a voltage difference between the bit line and the complementary bit line, and a capacitance adjusting circuit configured to adjust a load capacitance of the complementary bit line in response to a plurality of control signals.

15 Claims, 11 Drawing Sheets

SEMICONDUCTOR DEVICE, METHOD OF ADJUSTING LOAD CAPACITANCE FOR THE SAME, AND SEMICONDUCTOR SYSTEM INCLUDING THE SAME

CROSS-REFERENCE TO RELATED APPLICATIONS

This application claims priority under 35 U.S.C. §119(a) to Korean Patent Application No. 10-2010-0089746 filed on Sep. 14, 2010, the disclosure of which is incorporated by reference in its entirety herein.

BACKGROUND

1. Technical Field

Embodiments of the present inventive concept relate to a semiconductor device, and more particularly, to a semiconductor device for adjusting a load capacitance of a complementary bit line of a bit line sense amplifier, a method of adjusting the load capacitance of the complementary bit line, and a semiconductor system including the semiconductor device.

2. Discussion of Related Art

A bit line sense amplifier senses and amplifies a voltage difference between a bit line and a complimentary bit line of a memory cell. Layout methods for a memory cell array including a bit line sense amplifier include an open bit line method and a folded bit line method. The open bit line method allows a memory cell to be disposed at each intersection of a plurality of word lines and a plurality of bit lines, thereby minimizing chip area. In addition, the open bit line method allows a bit line sense amplifier to sense and amplify the voltage difference between a bit line and a complementary bit line, which are respectively connected to different memory cells, which are respectively connected to different word lines. However, in the resulting layout produced by the open bit line method, half of the bit lines at the edge of the memory cell array are dummy bit lines.

SUMMARY

An exemplary embodiment of the present inventive concept includes a semiconductor device for adjusting a load capacitance of a complementary bit line connected to a bit line sense amplifier to be the same or substantially the same as the load capacitance of a bit line connected to the bit line sense amplifier. An exemplary embodiment of the inventive concept includes a method of adjusting the load capacitance of the complementary bit line. An exemplary embodiment of the inventive concept includes at least one semiconductor system including the semiconductor device. The semiconductor device or the method may reduce a sensing loss of the bit line sense amplifier.

According to an exemplary embodiment of the present inventive concept, a semiconductor device includes a bit line, a complementary bit line, a sense amplifier configured to sense and amplify a voltage difference between the bit line and the complementary bit line, and a capacitance adjusting circuit configured to adjust a load capacitance of the complementary bit line in response to a plurality of control signals.

The capacitance adjusting circuit may include a plurality of adjusting blocks connected between the complementary bit line and a ground and capacitances of the respective adjusting blocks may be adjusted based on the control signals, respectively.

Alternatively, the capacitance adjusting circuit may include a plurality of capacitors; and a plurality of switches connected between the complementary bit line and the respective capacitors to respectively connect the capacitors to the complementary bit line in response to the plurality of control signals, respectively.

The capacitors may have different capacitances. Each of the capacitors may include at least one sub capacitor connected in series. The at least one sub capacitor may be connected to one another through at least one among a first connecting means and a second connecting means.

The semiconductor may further include a mode register set or a plurality of fuse circuits configured to generate the plurality of control signals for adjusting the load capacitance of the complementary bit line to be the same or substantially the same as a load capacitance of the bit line. The sense amplifier may have an open bit line architecture.

According to an exemplary embodiment of the present inventive concept, a method of adjusting a load capacitance of a complementary bit line of a sense amplifier in a semiconductor device includes generating a plurality of control signals and adjusting capacitance of each of a plurality of adjusting blocks connected between the complementary bit line and a ground based on a corresponding one of the control signals. The generating the plurality of control signals may include generating the plurality of control signals using a mode register set.

When each of the adjusting blocks includes a switch and at least one capacitor connected in series, the switch may control a connection between the complementary bit line and the at least one capacitor based on a corresponding one of the control signals.

According to an exemplary embodiment of the present inventive concept, a memory system may include the above-described semiconductor device and a processor configured to control operations of the semiconductor device.

According to an exemplary embodiment of the inventive concept, a memory module may include the above-described semiconductor device and a semiconductor substrate on which the semiconductor device is mounted.

According to an exemplary embodiment of the inventive concept, in a semiconductor system that includes the above-described memory module, the system includes a socket into which the memory module is inserted, and a processor configured to control operations of the semiconductor device mounted on the memory module through the socket.

According to an exemplary embodiment of the inventive concept, a semiconductor device includes a sense amplifier (e.g., a bit line sense amplifier) and an adjusting block. The sense amplifier senses and amplifies a voltage difference between a bit line and a complimentary bit line. The bit line and complimentary bit lines may be connected to a same word line. The adjusting block is configured to output an adjusting signal to the complimentary bit line in response to a control signal. The adjusting block includes a transistor having a first non-gate terminal connected to the complimentary bit line and a second non-gate terminal, a conductive material overlapping with a portion of a capacitive material, and at least one metal contact. One end of a first part of the capacitive material receives a ground voltage and the other end is connected to the second non-gate terminal, and a second part of the capacitive material is connected to a floating voltage. The at least one metal contacts are connected to the capacitive material in the portion that does not overlap with the conductive material. The floating voltage may prevent the second part of the capacitive material from functioning as a capacitor.

The semiconductor device may further include a second adjusting block configured to output a second adjusting signal to the complimentary bit line in response to a second control signal. The second adjusting block may include a second transistor having a third non-gate terminal connected to the complimentary bit line and a fourth non-gate terminal, a second capacitive material including first, second, third, and fourth portions and a second conductive material overlapping with the first and second portions, and first and second metal contacts connected to the third and fourth portions, respectively. The second portion may be connected to one of the third and fourth portions. The first portion may be connected to the fourth non-gate terminal, and the second portion may be connected to the first portion through the second conductive material.

BRIEF DESCRIPTION OF THE DRAWINGS

The present inventive concept will become more apparent by describing in detail exemplary embodiments thereof with reference to the attached drawings in which.

DETAILED DESCRIPTION

Figure 1:
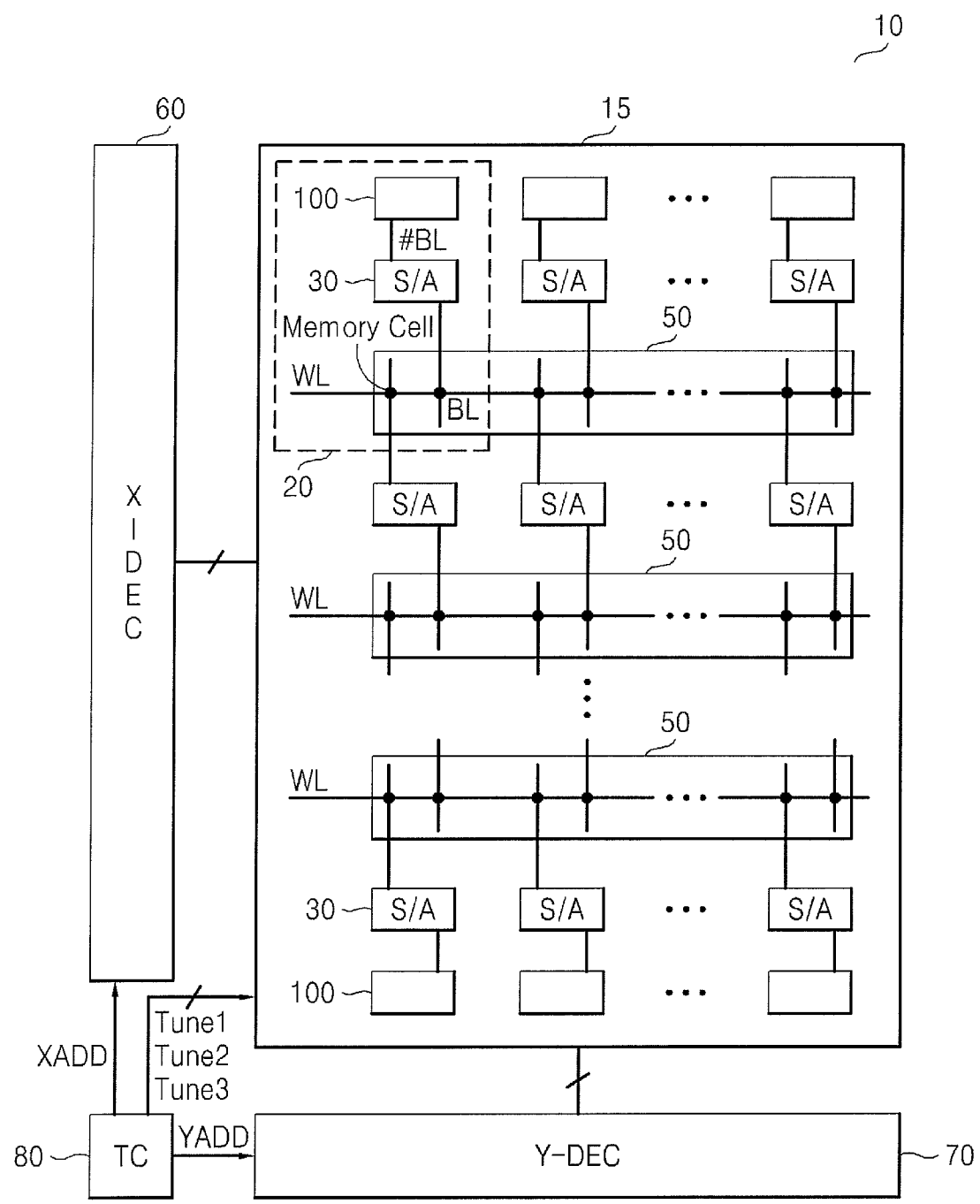
FIG. 1 is a block diagram of a semiconductor device according to an exemplary embodiment of the present inventive concept.

The present inventive concept now will be described more fully hereinafter with reference to the accompanying drawings, in which exemplary embodiments thereof are shown. The inventive concept may, however, be embodied in many different forms and should not be construed as limited to the exemplary embodiments set forth herein. In the drawings, the size and relative sizes of layers and regions may be exaggerated for clarity. Like numbers refer to like elements throughout. It will be understood that when an element is referred to as being "connected" or "coupled" to another element, it can be directly connected or coupled to the other element or intervening elements may be present.

FIG. 1 is a block diagram of a semiconductor device 10 according to an exemplary embodiment of the present inventive concept. The semiconductor device 10 includes a memory cell array 15, a row decoder 60, a column decoder 70, and a timing controller 80.

The semiconductor device 10 can adjust the load capacitance or parasitic capacitance of a complementary bit line #BL. Parasitic capacitance is unwanted capacitance that may be present between circuit components merely due their proximity to one another. The semiconductor device 10 may be implemented by volatile or non-volatile memory including a sense amplifier using an open bit line method.

As an example, the volatile memory may be dynamic random access memory (DRAM), static RAM (SRAM), thyristor-RAM (T-RAM), zero-capacitor RAM (Z-RAM), or twin transistor RAM (TTRAM). As an example, the non-volatile memory may be electrically erasable programmable read-only memory (EEPROM), flash memory, ferroelectric RAM (FeRAM), magnetoresistive RAM (MRAM), phase-change RAM (PRAM), resistive RAM (RRAM), or nano-RAM (NRAM). For clarity of the below description, it is assumed that the semiconductor device 10 is implemented by DRAM, but the inventive concept can be applied to both volatile and non-volatile memory devices.

The memory cell array 15 includes a plurality of capacitance adjusting circuits 100, a plurality of bit line sense amplifiers 30, and a plurality of sub memory cell arrays 50. For clarity of the description, the semiconductor device 10 will be described by explaining an array unit 20 illustrated in FIG. 1.

Each sub memory cell array 50 includes a plurality of memory cells connected to a word line WL and a plurality of bit lines BL. Each bit line sense amplifier 30 senses and amplifies the difference between a voltage of a bit line BL and a complementary bit line #BL. The bit line sense amplifier 30 may be applied to any semiconductor device, e.g., any volatile or non-volatile semiconductor device. The semiconductor devices may use an open bit line architecture or an open bit line sense amplification scheme, as an example.

The capacitance adjusting circuit 100 is connected to the complementary bit line #BL and adjusts the load capacitance of the complementary bit line #BL in response to a plurality of control signals Tune1, Tune2, and Tune3 output from the timing controller 80. The row decoder 60 decodes a row address XADD received from the timing controller 80 and selects one of the word lines WL in the sub memory cell array 50 based on a result of the decoding. The column decoder 70 decodes a column address YADD received from the timing generator 80 and selects at least one of the bit lines BL in the sub memory cell array 50 based on a result of the decoding.

Figure 2:
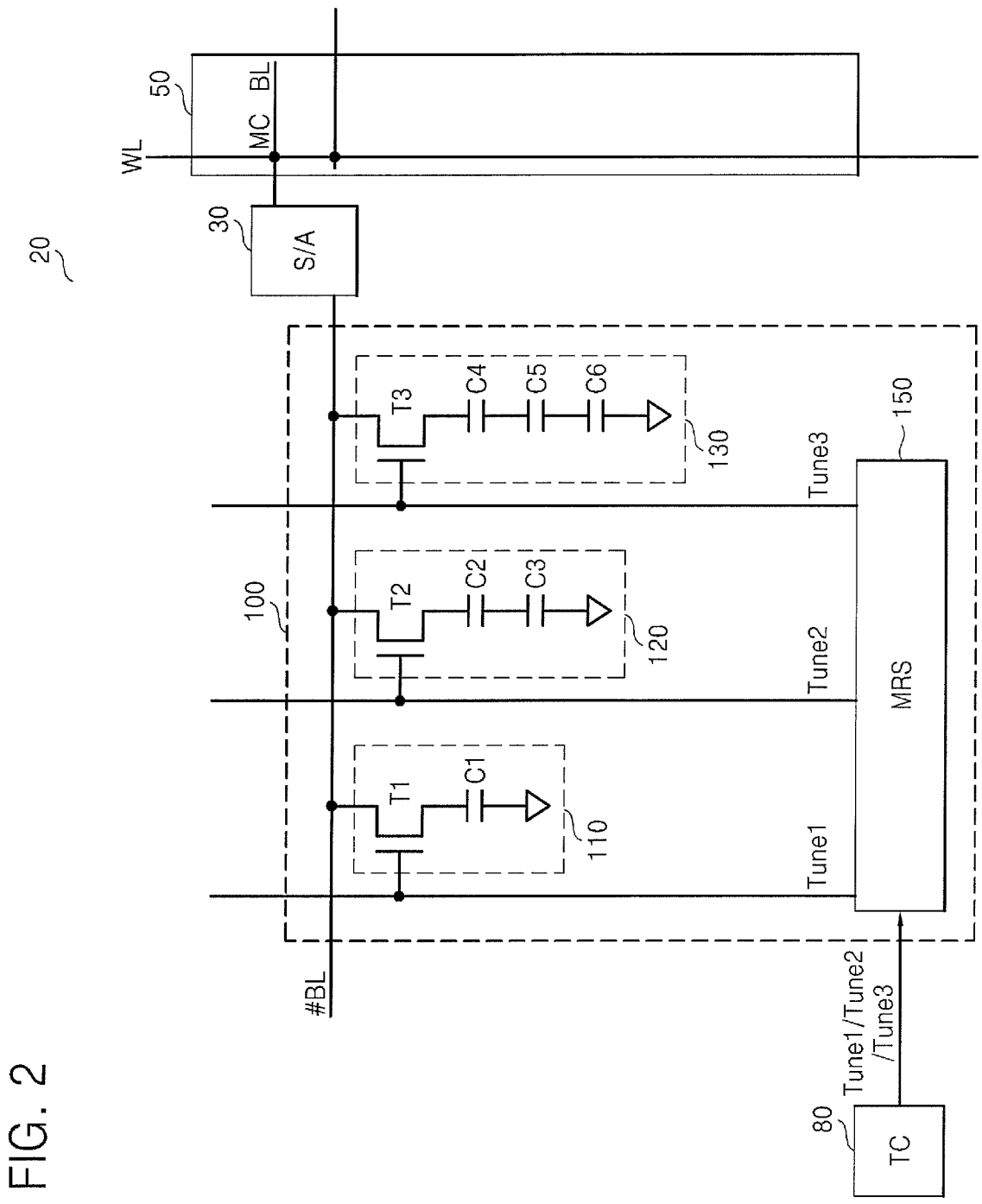
FIG. 2 shows a capacitance adjusting circuit illustrated in FIG. 1 according to an exemplary embodiment of the present inventive concept.

FIG. 2 shows the capacitance adjusting circuit 100 illustrated in FIG. 1 according to an exemplary embodiment of the inventive concept. Referring to FIGS. 1 and 2, the capacitance adjusting circuit 100 includes a first adjusting block 110, a second adjusting block 120, and a third adjusting block 130.

The first adjusting block 110 includes a first capacitor C1 and a first switch T1, which connects the first capacitor C1 to the complementary bit line #BL in response to the first control signal Tune1. The second adjusting block 120 includes a second capacitor C2 and a third capacitor C3, which are connected in series, and a second switch T2 which connects the second capacitor C2 to the complementary bit line #BL in response to the second control signal Tune2. The third adjusting block 130 includes a fourth capacitor C4, a fifth capacitor C5, and a sixth capacitor C6, which are connected in series, and a third switch T3 which connects the fourth capacitor C4 to the complementary bit line #BL in response to the third control signal Tune3. The capacitance of the first through sixth capacitors C1 through C6 may be the same or different. The switches T1, T2, and T3 may be transistors.

For clarity of the description, the capacitance adjusting circuit 100 includes the three adjusting blocks 110, 120, and 130, but the number of adjusting blocks may be lesser or greater than three (e.g., 1, 2, 4, 5, etc.). In at least one embodiment of the inventive concept, the capacitances of the adjusting blocks are different from one another. In at least one embodiment of the inventive concept, each of the switches T1, T2, and T3 is implemented by a metal-oxide semiconductor (MOS) transistor. However, the inventive concept is not limited thereto, as alternate embodiments of the inventive concept may use a transistor type that differs from the metal-oxide type.

The control signals Tune1, Tune2, and Tune3 may be generated by the timing controller 80, as illustrated in FIG. 1, or by a mode register set (MRS) 150, as illustrated in FIG. 2. While the MRS 150 is illustrated within the capacitance adjusting circuit 100 in FIG. 2, in alternate embodiments, it may be provided outside the capacitance adjusting circuit 100 or within the timing controller 80. Further, in alternative embodiments, the control signals Tune1, Tune2, and Tune3 may be generated by a plurality of fuse circuits.

The capacitance adjusting circuit 100 adjusts the load capacitance of the complementary bit line #BL in response to the control signals Tune1, Tune2, and Tune3, as shown in Table 1. For ease of discussion, it is assumed that the capacitors C1 through C6 have the same capacitance of 1 Cbal and the capacitance of the complementary bit line #BL and the capacitance of the switches T1 through T3 are not considered.

TABLE 1

| Case | C total | Tune1 | Tune2 | Tune3 |
|------|---------|-------|-------|-------|
| Case1 | 1/2 Cbal | L | H | L |
| Case2 | 1/3 Cbal | L | L | H |
| Case3 | 1 Cbal | H | L | L |
| Case4 | 4/3 Cbal | H | L | H |

Referring to Table 1, an 'H' indicates a tuning signal is at a logical high level and an 'L' indicates that a tuning signal is at logical low level. Case1 shows the capacitance of the complementary bit line #BL adjusted by the second adjusting block 120 when the second control signal Tune2 at the high level is applied to the second switch T2 of the second adjusting block 120. In other words, the capacitance adjusting circuit 100 adjusts the load capacitance of the complementary bit line #BL to ½ Cbal, the capacitance of the second adjusting block 120. As a result, the load capacitance of the bit line BL can be substantially the same as the load capacitance of the complementary bit line #BL.

Case2 shows the capacitance of the complementary bit line #BL adjusted by the third adjusting block 130 when the third control signal Tune3 at the high level is applied to the third switch T3 of the third adjusting block 130. In other words, the capacitance adjusting circuit 100 adjusts the load capacitance of the complementary bit line #BL to ⅓ Cbal, the capacitance of the third adjusting block 130. As a result, the load capacitance of the bit line BL can be substantially the same as the load capacitance of the complementary bit line #BL.

Case3 shows the capacitance of the complementary bit line #BL adjusted by the first adjusting block 110 when the first control signal Tune1 at the high level is applied to the first switch T1 of the first adjusting block 110. In other words, the capacitance adjusting circuit 100 adjusts the load capacitance of the complementary bit line #BL to 1 Cbal, the capacitance of the first adjusting block 110. As a result, the load capacitance of the bit line BL can be substantially the same as the load capacitance of the complementary bit line #BL.

Case4 shows the capacitance of the complementary bit line #BL adjusted by the first and third adjusting blocks 110 and 130 when the first and third control signals Tune1 and Tune3 at the high level are respectively applied to the first and third switches T1 and T3 of the respective first and third adjusting blocks 110 and 130. In other words, the capacitance adjusting circuit 100 adjusts the load capacitance of the complementary bit line #BL to the sum of 1 Cbal, the capacitance of the first adjusting block 110, and ⅓ Cbal, the capacitance of the third adjusting block 130. As a result, the load capacitance of the bit line BL can be substantially the same as the load capacitance of the complementary bit line #BL.

While Table 1 shows four exemplary cases, the present invention is not limited to those cases. For example, the capacitance adjusting circuit 100 may adjust the load capacitance of the complementary bit line #BL based on various combinations of the control signals Tune1, Tune2, and Tune3.

As described above, the capacitance adjusting circuit 100 adjusts in response to the control signals Tune1, Tune2, and Tune3 so that the load capacitance of the complementary bit line #BL and the load capacitance of the bit line BL are substantially the same, thereby preventing or reducing the sensing loss of the sense amplifier 30. A capacitance being substantially the same as another may indicate that the capacitances are within an error tolerance of one another.

Figure 3:
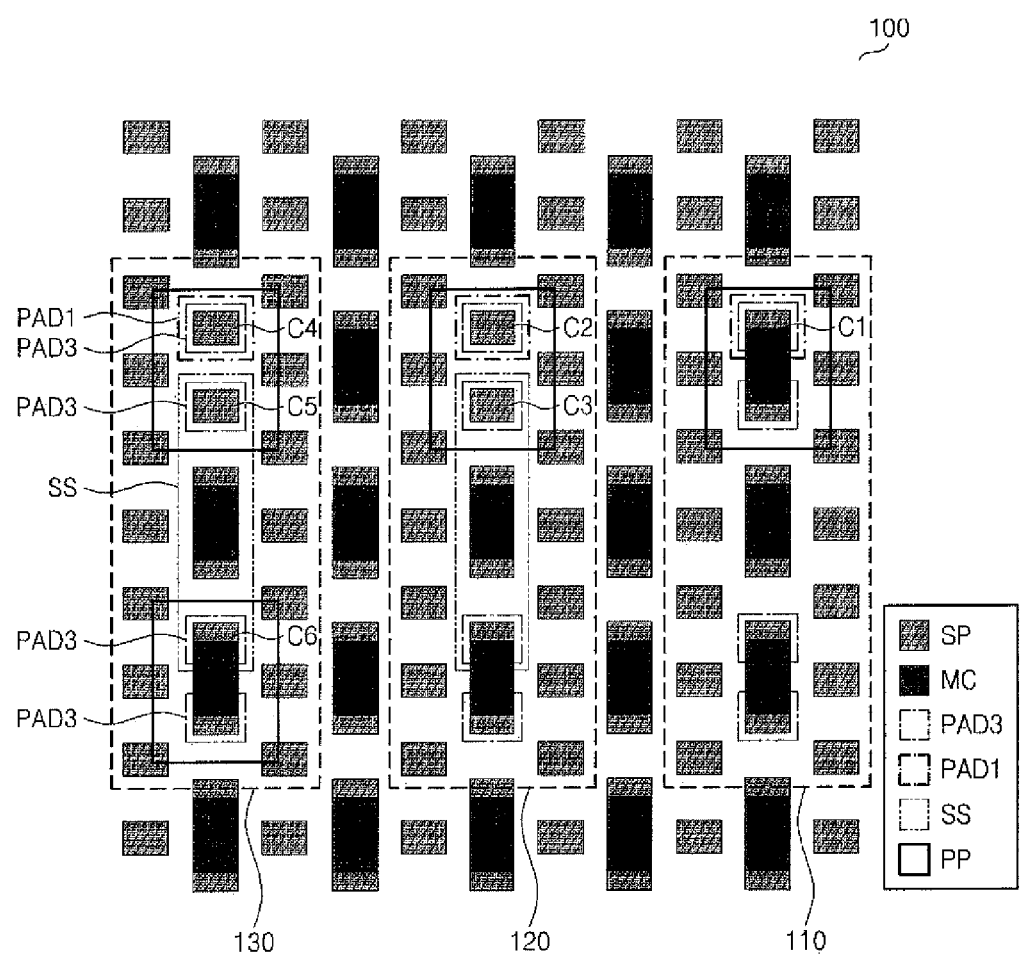
FIG. 3 shows the top layer of the capacitance adjusting circuit illustrated in FIG. 2 according to an exemplary embodiment of the present inventive concept.
Figure 4:
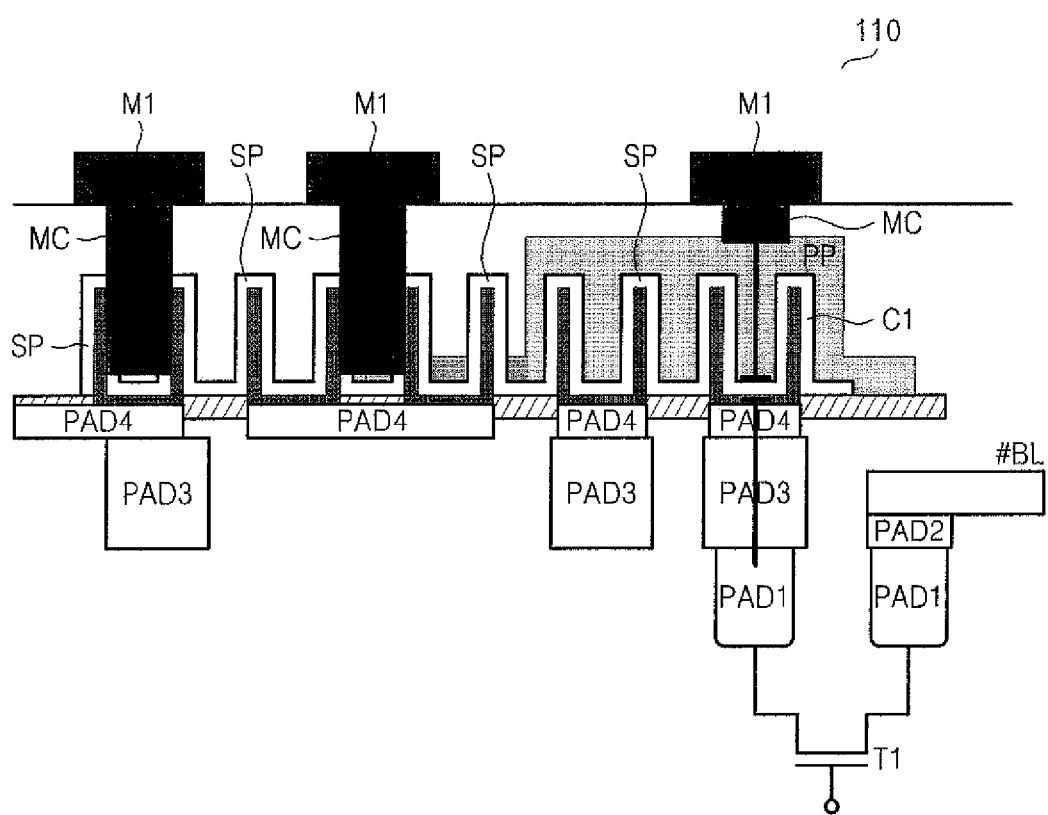
FIG. 4 is a cross-sectional view of a first adjusting block illustrated in FIG. 3 according to an exemplary embodiment of the present inventive concept.
Figure 5:
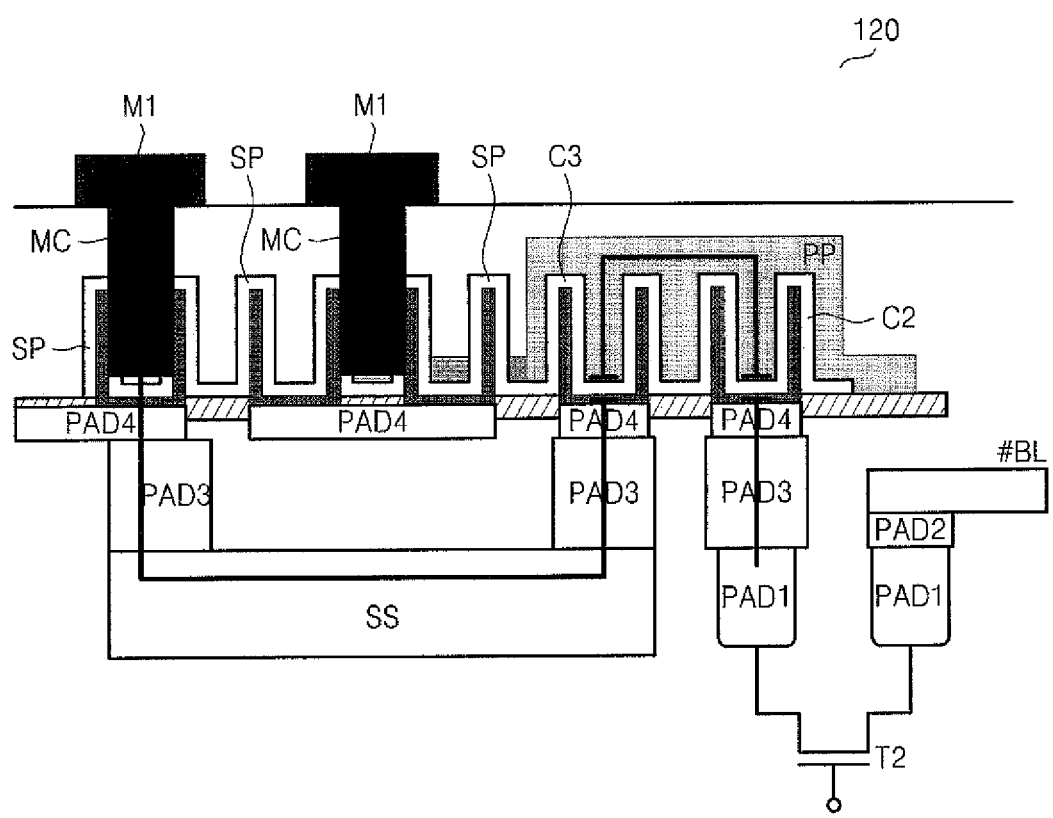
FIG. 5 is a cross-sectional view of a second adjusting block illustrated in FIG. 3 according to an exemplary embodiment of the present inventive concept.
Figure 6:
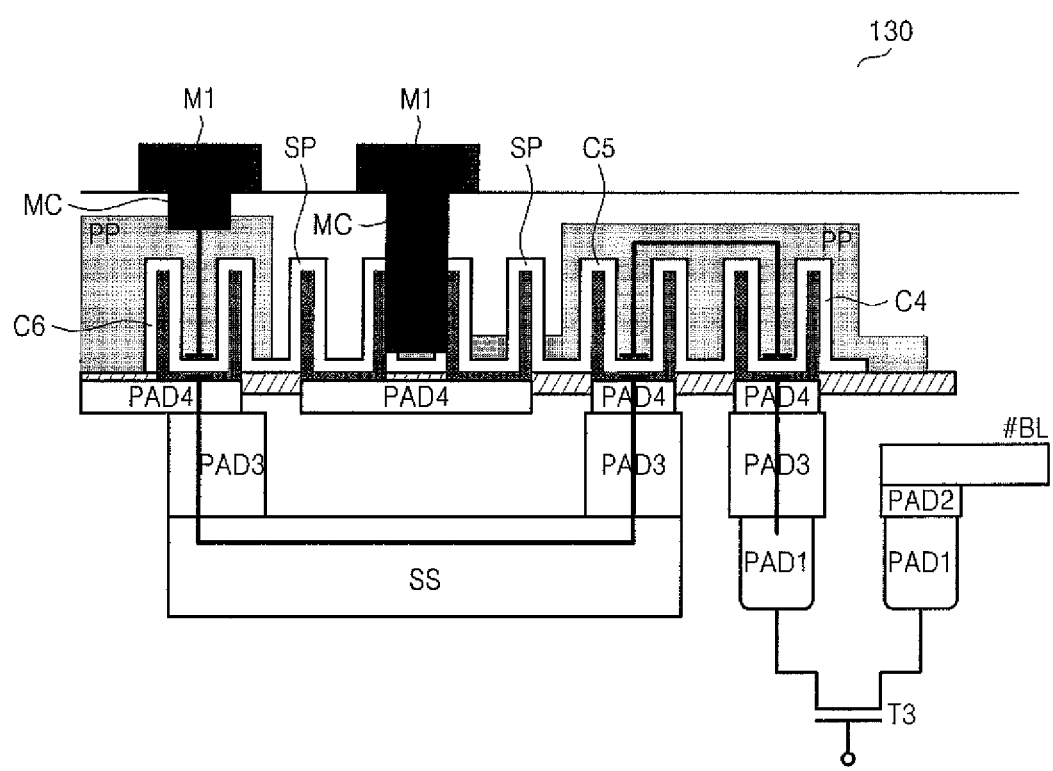
FIG. 6 is a cross-sectional view of a third adjusting block illustrated in FIG. 3 according to an exemplary embodiment of the present inventive concept.

FIG. 3 shows the top layer of the capacitance adjusting circuit 100 illustrated in FIG. 2 according to an exemplary embodiment of the inventive concept. FIG. 4 is a cross-sectional view of the first adjusting block 110 illustrated in FIG. 3 according to an exemplary embodiment of the inventive concept. FIG. 5 is a cross-sectional view of the second adjusting block 120 illustrated in FIG. 3 according to an exemplary embodiment of the inventive concept. FIG. 6 is a cross-sectional view of the third adjusting block 130 illustrated in FIG. 3 according to an exemplary embodiment of the inventive concept.

Referring to FIG. 3, the capacitance adjusting circuit 100 is formed on a layer including a plurality of capacitors SP arranged in a certain pattern. Multiple capacitors SP are connected to one another by a first connecting means PP (e.g., a conductor or conductive material) or a second connecting means SS (e.g., a conductor or conductive material) so that one or more capacitors (e.g., the capacitor C1, the capacitors C2 and C3, and the capacitors C4 through C6) connected in series can be formed for each of the adjusting blocks 110, 120, and 130.

Referring to FIGS. 3 and 4, in the structure of the first adjusting block 110 of the capacitance adjusting circuit 100, a drain electrode of the first switch T1 implemented by a transistor is connected to the complementary bit line #BL through a first contact pad PAD1 and a second contact pad PAD2. A source electrode of the first switch T1 is connected to a first electrode of the first capacitor C1 through the first contact pad PAD1, a third contact pad PAD3, and a fourth contact pad PAD4. A second electrode of the first capacitor C1 is connected to a metal contact MC formed in the first connecting means PP.

A plurality of contact pads PAD1 through PAD4 are used to electrically connect semiconductor elements to one another and are arranged in a certain pattern on the layer on which the capacitance adjusting circuit 100 is formed.

A third connecting means M1 (e.g., a conductor or conductive material) may be formed on the metal contact MC to connect the metal contact MC to an external metal line. The third connecting means M1 receives a predetermined voltage from the external metal line and applies the predetermined voltage to the second electrode of the first capacitor C1. The predetermined voltage received from the external metal line may be a ground voltage as an example.

A capacitor SP (e.g., a capacitive material) positioned within the first connecting means PP is floated and does not function as a capacitor. A metal contact MC is connected to each of capacitors SP that are positioned outside the first connecting means PP so that parasitic capacitance may be reduced or eliminated. Accordingly, only the first switch T1 and the first capacitor C1 are present in the first adjusting block 110.

Referring to FIGS. 3 and 5, in the structure of the second adjusting block 120 of the capacitance adjusting circuit 100, the connection between drain and source electrodes of the second switch T2 implemented by a transistor is similar to that of the first switch T1 illustrated in FIG. 4.

A second electrode of the second capacitor C2 is connected to a first electrode of the third capacitor C3 through a first connecting means PP. A metal contact MC is connected to each of capacitors SP that are positioned outside the first connecting means PP so that parasitic capacitance may be reduced or eliminated.

A second electrode of the third capacitor C3 is connected to a metal contact MC through a fourth contact pad PAD4, a third contact pad PAD3, and a second connecting means SS. Accordingly, only the second switch T2 and the second and third capacitors C2 and C3 connected in series are present in the second adjusting block 120.

Referring to FIGS. 3 and 6, in the structure of the third adjusting block 130, the connection between drain and source electrodes of the third switch T3 implemented by a transistor is similar to that of the first switch T1 illustrated in FIG. 4.

A second electrode of the fourth capacitor C4 is connected to a first electrode of the fifth capacitor C5 through a first connecting means PP. A second electrode of the fifth capacitor C5 is connected to a first electrode of the sixth capacitor C6 through fourth contact pad PAD4, a third contact pad PAD3, and a second connecting means SS.

A second electrode of the sixth capacitor C6 is connected to a metal contact MC through a first connecting means PP formed on the sixth capacitor C6. Each of capacitors SP outside the first connecting means PP is connected to a metal contact MC so that parasitic capacitance may be reduced or eliminated. Accordingly, only the third switch T3 and the fourth through sixth capacitors C4 through C6 connected in series are present in the third adjusting block 130.

Figure 7:
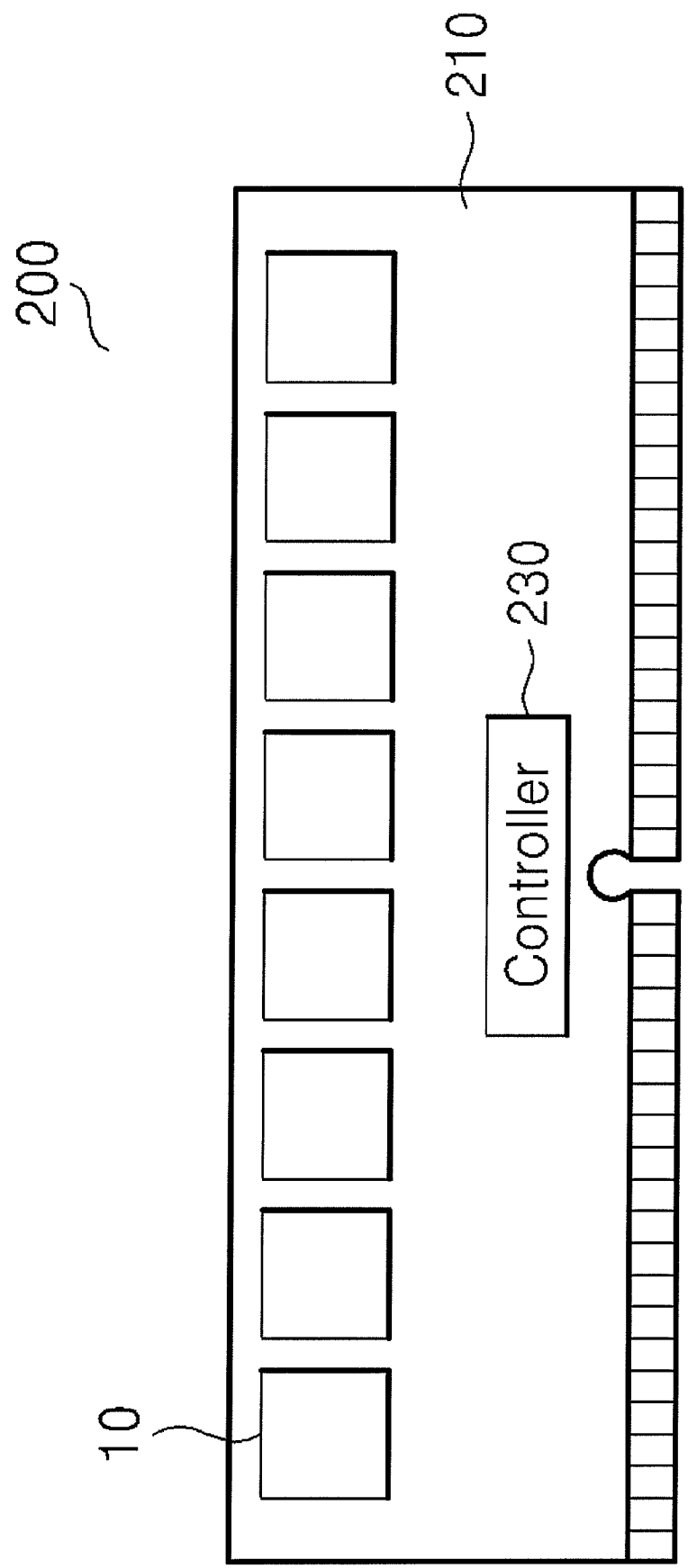
FIG. 7 is a diagram of a memory module including the semiconductor device illustrated in FIG. 1 according to an exemplary embodiment of the present inventive concept.

FIG. 7 is a diagram of a memory module 200 including the semiconductor device 10 illustrated in FIG. 1. Referring to FIG. 7, the memory module 200 includes a semiconductor substrate 210 and a plurality of semiconductor devices 10 mounted on the semiconductor substrate 210. The structure and the operations of the semiconductor devices 10 are substantially the same as those of the semiconductor device 10 described with reference to FIGS. 1 through 6.

The memory module 200 may also include a controller 230 controlling the operations of the semiconductor devices 10, respectively. As an example, the memory module 200 may be implemented by a single in-line memory module (SIMM) or a dual in-line memory module (DIMM).

Figure 8:
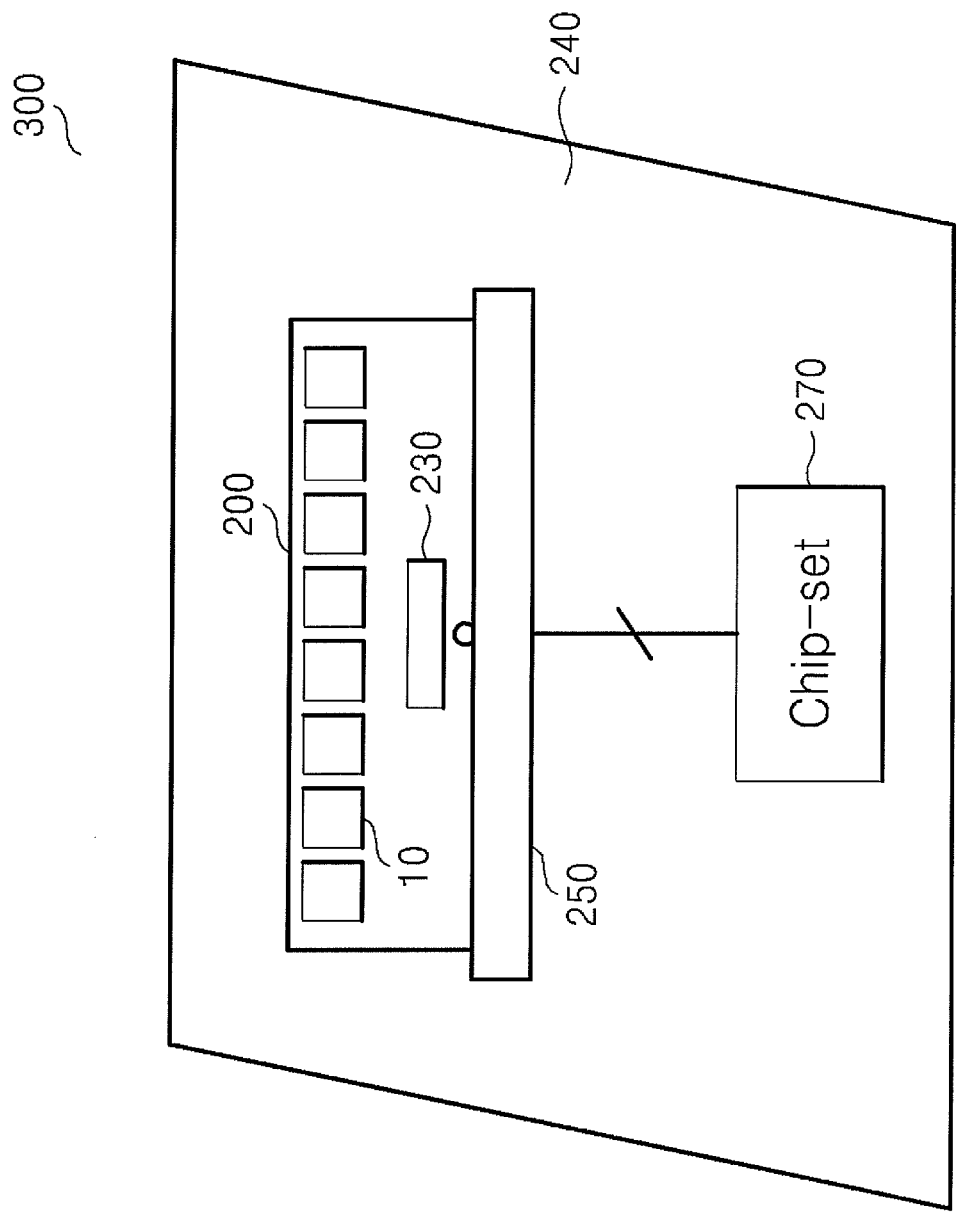
FIG. 8 is a block diagram of a computer including the memory module illustrated in FIG. 7 according to an exemplary embodiment of the present inventive concept.

FIG. 8 is a block diagram of a computer 300 including the memory module 200 illustrated in FIG. 7. The memory system 300 may be implemented by a computer system. The memory system 300 includes a main board 240, a slot 250 mounted on the main board 240, the memory module 200 inserted into the slot 250, and a processor, e.g., a chip-set 270, controlling the operations of the semiconductor devices 10 mounted on the memory module 200, respectively.

The chip-set 270 may exchange data with the semiconductor devices 10 through a data bus. The memory system 300 may be implemented on a personal computer (PC), a tablet PC, or a notebook computer.

Figure 9:
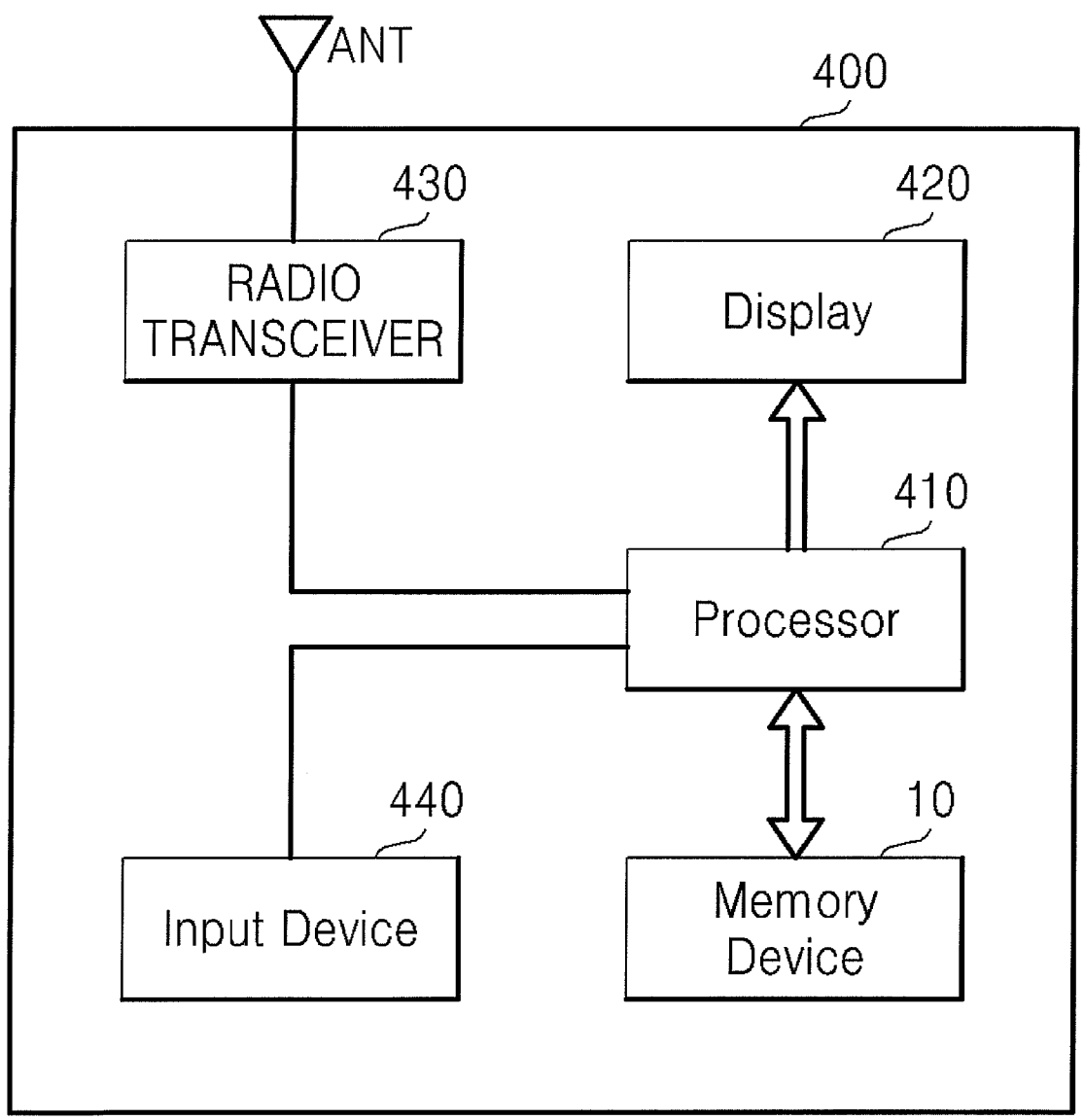
FIG. 9 is a memory system according to an exemplary embodiment of the present inventive concept including the semiconductor device illustrated in FIG. 1.

FIG. 9 is a memory system 400 according to an exemplary embodiment of the present inventive concept including the semiconductor device 10 illustrated in FIG. 1. Referring to FIG. 9, the memory system 400 may be implemented by a cellular phone, a smart phone, or a wireless Internet device. The memory system 400 includes the semiconductor device 10 and a processor 410 controlling the data processing operations of the semiconductor device 10. Data stored in the semiconductor device 10 may be controlled by the processor 410 to be displayed through a display 420.

The memory system 400 may also include a radio transceiver 430, which transmits or receives radio signals through an antenna ANT. The radio transceiver 430 may convert radio signals received through the antennal ANT into signals that can be processed by the processor 410. The processor 410 may process the signals output from the radio transceiver 430 and store the processed signals in the semiconductor device 10 or display them through the display 420. The radio transceiver 430 may also convert signals output from the processor 410 into radio signals and output them through the antenna ANT.

The memory system 400 may also include an input device 440, which enables control signals to be input for controlling the operations of the processor 410 or input data to be processed by the processor 410. As an example, the input device 440 may be implemented by a pointing device such as a touch pad or a computer mouse, a keypad, or a keyboard.

The processor 410 may control the display 420 to display data output from the semiconductor device 10, data output from the radio transceiver 430, or data output from the input device 440.

Figure 10:
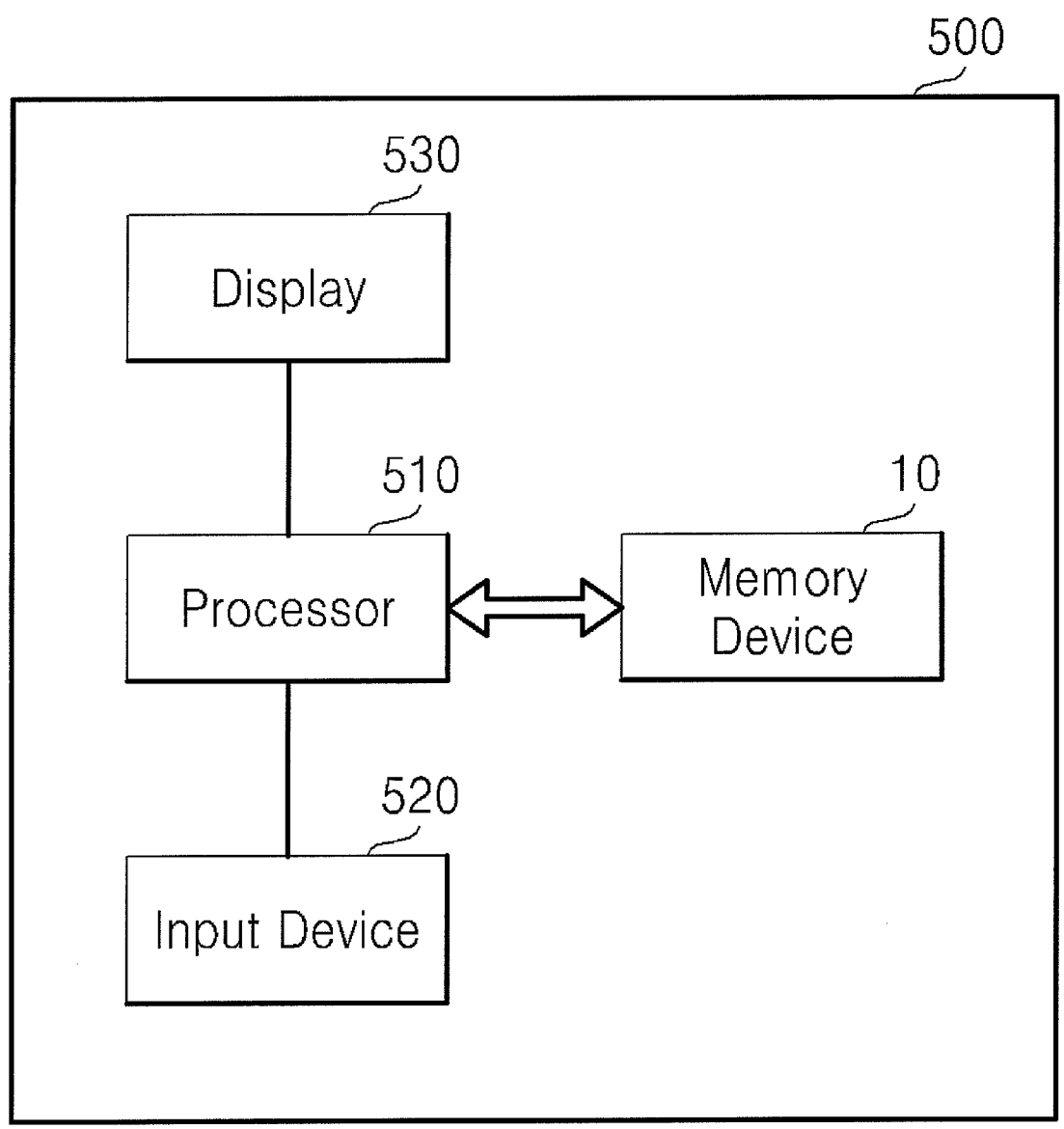
FIG. 10 is a memory system according to an exemplary embodiment of the present inventive concept including the semiconductor device illustrated in FIG. 1.

FIG. 10 is a memory system 500 according to an exemplary embodiment of the present inventive concept including the semiconductor device 10 illustrated in FIG. 1. The memory system 500 may be implemented by a data processing device such as a tablet computer, a net-book, an e-reader, a personal digital assistant (PDA), a portable multimedia player (PMP), an MP3 player, or an MP4 player. The memory system 500 includes the semiconductor device 10 and a processor 510 controlling the data processing operations of the semiconductor device 10.

The processor 510 may display data stored in the semiconductor device 10 through a display 530 in response to an input signal generated by an input device 520. As an example, the input device 520 may be implemented by a pointing device such as a touch pad or a computer mouse, a keypad, or a keyboard.

Figure 11:
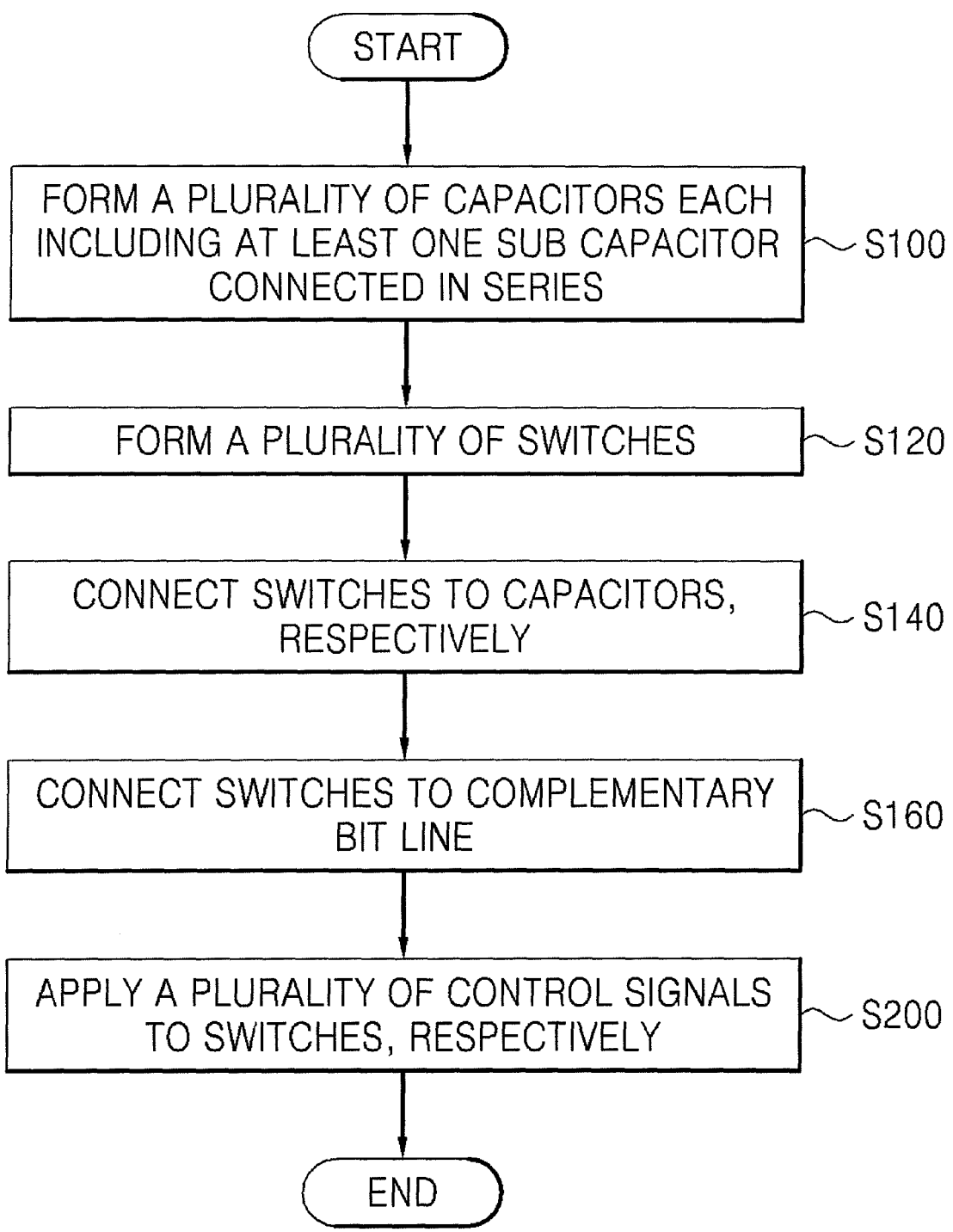
FIG. 11 is a flowchart of a method of adjusting the load capacitance of a complementary bit line of a sense amplifier in a semiconductor device according to an exemplary embodiment of the present inventive concept.

FIG. 11 is a flowchart of a method of adjusting the load capacitance of the complementary bit line #BL of a sense amplifier in a semiconductor device 10 according to an exemplary embodiment of the present inventive concept. Referring to FIGS. 2 through 6 and FIG. 11, a capacitor including one or more sub capacitors, e.g., the sub capacitor C1, the sub capacitors C2 and C3, or the sub capacitors C4 through C6, which are connected in series, is formed in each of the adjusting blocks 110, 120, and 130 in the capacitance adjusting circuit 100 in operation S100. The method of forming the sub capacitors C1 through C6 has been described above with reference to FIGS. 4 through 6.

The switches T1 through T3 are formed in the adjusting blocks 110, 120, and 130, respectively, in operation S120. Source electrodes of the respective switches T1 through T3 are respectively connected to the capacitors respectively included in the adjusting blocks 110, 120, and 130 in operation S140. A drain electrode of each of the switches T1 through T3 is connected to the complementary bit line #BL in operation S160.

The control signals Tune1, Tune2, and Tune3 are respectively applied to gate electrodes of the respective switches T1 through T3 in operation 5200. The control signals Tune1, Tune2, and Tune3 may be generated by the timing controller 80, the MRS 150, or a plurality of fuse circuits. When each of the control signals Tune1, Tune2, and Tune3 is applied to a corresponding switching among the switches T1 through T3, a corresponding capacitor is connected to the complementary bit line #BL. Accordingly, the load capacitance of the complementary bit line #BL is adjusted by the capacitance adjusting circuit 100.

As described above, according to at least one exemplary embodiment of the present inventive concept, the load capacitance of a complementary bit line in a semiconductor device is adjusted, so that the sensing loss of a bit line sense amplifier may be reduced or eliminated.

While the present inventive concept has been particularly shown and described with reference to exemplary embodiments thereof, it will be understood by those of ordinary skill in the art that various changes in forms and details may be made therein without departing from the spirit and scope of the disclosure.

What is claimed is:

1. A system including a semiconductor device, the semiconductor device comprising:
    a bit line;
    a complementary bit line;
    a sense amplifier configured to sense and amplify a voltage difference between the bit line and the complementary bit line; and
    a capacitance adjusting circuit configured to adjust a load capacitance of the complementary bit line in response to a plurality of control signals,
    wherein the capacitance adjusting circuit includes a plurality of capacitors disposed within a conductive material,
    wherein the conductive material connects the capacitors together in series, and the capacitance adjusting circuit further comprises another capacitor positioned outside the conductive material and a metal contact is connected to the another capacitor.

2. The system of claim 1, wherein the capacitance adjusting circuit comprises a plurality of adjusting blocks connected between the complementary bit line and a ground and capacitances of the respective adjusting blocks are adjusted based on the control signals, respectively.

3. The system of claim 1, wherein the capacitance adjusting circuit comprises:
    a plurality of switches connected between the complementary bit line and the respective capacitors to respectively connect the capacitors to the complementary bit line in response to the plurality of control signals, respectively.

4. The system of claim 1, wherein the capacitors have different capacitances.

5. The system of claim 1, wherein each of the capacitors comprises at least one sub capacitor connected in series.

6. The system of claim 5, wherein the at least one sub capacitor is connected to one another through conductive material.

7. The system of claim 1, further comprising a mode register set (MRS) configured to generate the plurality of control signals for adjusting the load capacitance of the complementary bit line to be substantially the same as load capacitance of the bit line.

8. The system of claim 1, further comprising a plurality of fuse circuits configured to generate the plurality of control signals.

9. The system of claim 1, wherein the sense amplifier is provided in an open bit line architecture.

10. The system of claim 1, wherein the system is a memory system and further comprises a processor configured to control operations of the semiconductor device.

11. The system of claim 1, wherein the system is a memory module and further comprises a semiconductor substrate on which the semiconductor device is mounted.

12. The system of claim 11, further comprising:
    a socket into which the memory module is inserted; and
    a processor configured to control operations of the semiconductor device mounted on the memory module through the socket.

13. A method of adjusting load capacitance of a complementary bit line of a sense amplifier in a semiconductor device, the method comprising:
    generating a plurality of control signals; and
    adjusting capacitance of each of a plurality of adjusting blocks connected between the complementary bit line and a ground based on a corresponding one of the control signals,
    wherein one of the adjusting blocks comprises capacitors disposed within a conductive material,
    wherein the conductive material connects the capacitors together in series and one adjusting block further comprises another capacitor positioned outside the conductive material and a metal contact is connected to the another capacitor.

14. The method of claim 13, wherein the generating the plurality of control signals comprises generating the plurality of control signals using a mode register set.

15. The method of claim 13, wherein when each of the adjusting blocks comprises a switch and the corresponding capacitors connected in series, the switch controls connection between the complementary bit line and the at least one capacitor based on a corresponding one of the control signals.

* * * * *